(12) United States Patent
Wang

(10) Patent No.: US 11,076,500 B2
(45) Date of Patent: Jul. 27, 2021

(54) ELECTRONIC APPARATUS AND CONNECTION STRUCTURE

(71) Applicant: Lenovo (Beijing) Co., Ltd., Beijing (CN)

(72) Inventor: Lijun Wang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/833,572

(22) Filed: Mar. 28, 2020

(65) Prior Publication Data
US 2020/0315051 A1  Oct. 1, 2020

(30) Foreign Application Priority Data
Mar. 29, 2019 (CN) .......................... 201910252085.5

(51) Int. Cl.
H05K 1/00 (2006.01)
H05K 7/02 (2006.01)
G06F 1/16 (2006.01)

(52) U.S. Cl.
CPC ............. *H05K 7/02* (2013.01); *G06F 1/1683* (2013.01)

(58) Field of Classification Search
USPC ......................................................... 361/749
See application file for complete search history.

(56) References Cited

U.S. PATENT DOCUMENTS

2010/0149764 A1* 6/2010 Ueyama ................ G06F 1/1683
361/749

* cited by examiner

*Primary Examiner* — Andargie M Aychillhum
(74) *Attorney, Agent, or Firm* — Anova Law Group, PLLC

(57) ABSTRACT

An electronic apparatus includes a first body, a second body, a rotating shaft structure, a connection structure, and a circuit board. The rotating shaft structure is configured to connect the first body and the second body. The connection structure includes a first connection terminal, which is connected to the first body, and a second connection terminal, which is connected to the second body. The circuit board is connected to the first connection terminal and the second connection terminal and configured non-planarly along an axial direction of the rotating shaft structure.

19 Claims, 5 Drawing Sheets

ELECTRONIC APPARATUS AND CONNECTION STRUCTURE

CROSS-REFERENCE TO RELATED APPLICATION

This application claims priority to Chinese Patent Application No. 201910252085.5, filed on Mar. 29, 2019, the entire content of which is incorporated herein by reference.

TECHNICAL FIELD

The present disclosure relates to the technology field of electronics, more particularly, to a connection structure and an electronic apparatus.

BACKGROUND

Electronic devices, such as a notebook or a tablet, can be opened and closed. An Ultrabook has two relatively rotating parts. If electrical signals need to be transmitted between these two parts, they are usually connected by flexible wires. By using the flexible wires to connect the two parts, when the two parts rotate relative to each other, connection failures due to stretching of rigid connection wires can be avoided. However, the flexible wire is bulky, which is not beneficial for further lightening and thinning the electronic devices.

SUMMARY

Embodiments of the present disclosure provide an electronic apparatus, which includes a first body, a second body, a rotating shaft structure, a connection structure, and a circuit board. The rotating shaft structure is configured to connect the first body and the second body. The connection structure includes a first connection terminal, which is connected to the first body, and a second connection terminal, which is connected to the second body. The circuit board is connected to the first connection terminal and the second connection terminal and configured non-planarly along an axial direction of the rotating shaft structure.

Embodiments of the present disclosure provide a connection structure, which includes a first connection terminal, a second connection terminal, and a circuit board. The circuit board is connected to the first connection terminal and the second connection terminal, and configured non-planarly along a pre-determined direction.

DETAILED DESCRIPTION OF THE EMBODIMENTS

A technical solution of the present disclosure is further described in detail in connection with accompanying drawings and specific embodiments.

Figure 1:
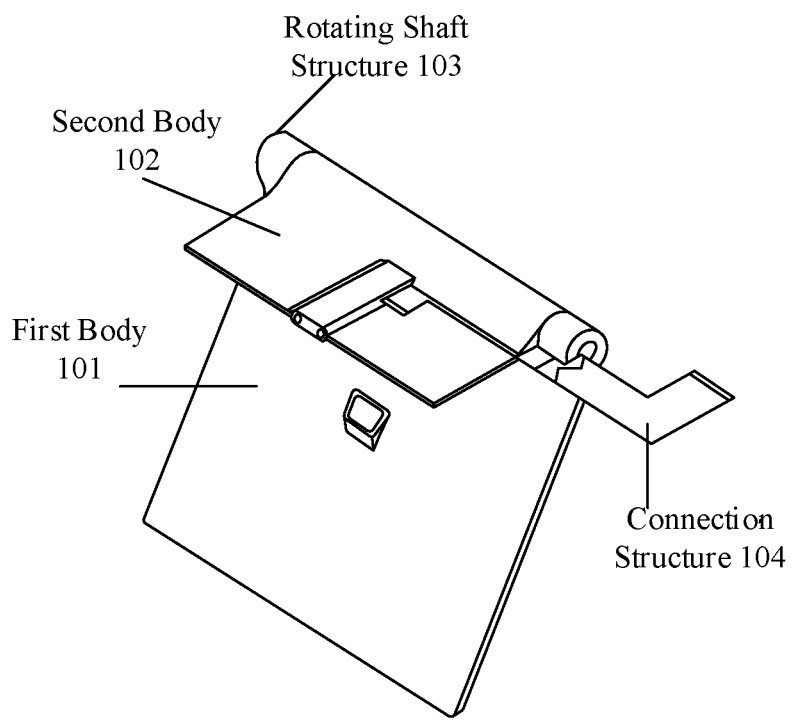
FIG. 1 is a schematic structural diagram of a first electronic apparatus according to the embodiments of the present disclosure.
Figure 2:
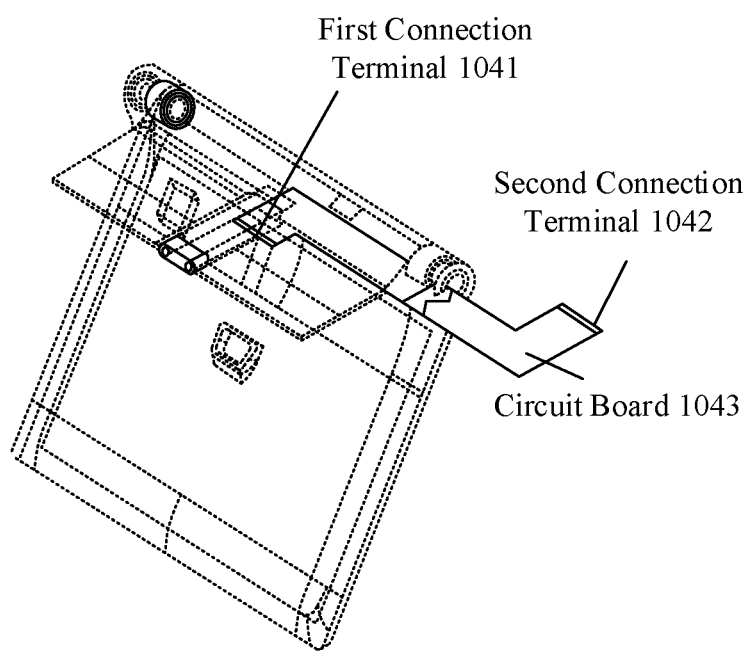
FIG. 2 is a schematic structural diagram of a second electronic apparatus according to the embodiments of the present disclosure.

As shown in FIG. 1 and FIG. 2, the embodiments of the present disclosure provide an electronic apparatus, which includes a first body 101, a second body 102, a rotating shaft structure 103 configured to connect the first body 101 and the second body 102. The first body 101 and the second body 102 can rotate relatively. A connection structure including at least one first connection terminal 1041 is configured to be connected to the first body 101 and at least one second connection terminal 1042 configured to be connected to the second body 102. The electronic apparatus further includes a circuit board 1043 configured to be connected to the first connection terminal 1041 and the second connection terminal 1042 and be configured non-planarly along an axial direction of the rotating shaft structure 103.

The electronic apparatus provided by the embodiments may be an apparatus of various types that have two bodies. For example, the electronic apparatus may be a notebook, a tablet having two bodies, and a two-in-one notebook and tablet.

In the embodiments, the first body 101 and the second body 102 may be any two structures connected by a rotating shaft.

Figure 6:
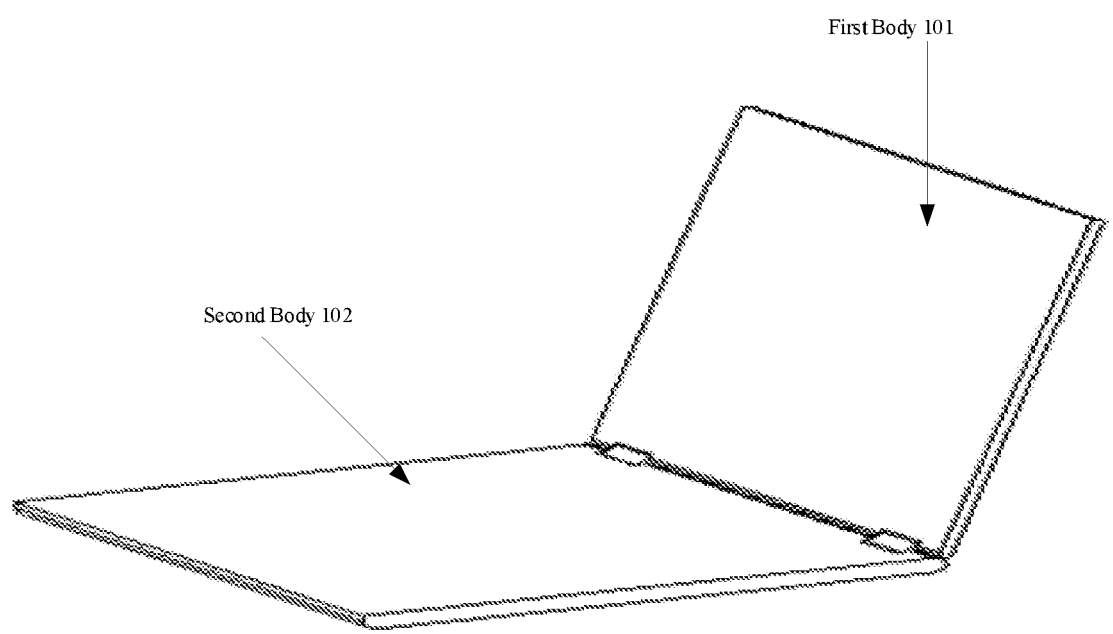
FIG. 6 a schematic structural diagram of an electronic apparatus provided by the embodiments of the present disclosure.

In some embodiments, the first body 101 and the second body 102 include housings, respectively. Various structures are configured at the housings. For example, a display device or an input device. Some embodiments provide the input device at the first body 101 and the display device at a second body 102. Some embodiments provide the first display device at the first body 101 and the second display device at the second body 102. The input structure includes, but is not limited, to a component having an input function such as a keyboard, a touchpad, etc. FIG. 6 shows a schematic structural diagram of the electronic apparatus that both of the first body 101 and the second body 102 include the display devices.

The first display device and the second display device may include various display screens. For example, according to whether the display screen can be bent, the display screen may include a flexible display device and a rigid display device. According to display principles, the display screen may include a liquid crystal display device, an organic light emitting diode (OLED) display device, an electronic ink display device, a projection display device, etc. In some embodiments, the first display device and the second display device may be two individual devices. In other embodiments, the first display device and the second display device may be different display sections of the same display device.

In some embodiments, the two bodies are physically connected by the rotating shaft. The first body 101 and the second body 102 can rotate relatively through the rotating shaft structure 103. For example, an angle between the first body 101 and the second body 102 can be switched from a first angle to a second angle. Assume that the first angle is 0° and the second angle may be 180° or 360°. FIG. 6 shows a schematic diagram when the angle between the first body 101 and the second body 102 is more than 90°.

The rotating shaft structure 103 includes one or a plurality of rotating shafts. If the rotating shaft structure 103 includes a plurality of rotating shafts, the plurality of rotating shafts may be configured in parallel positions. That is, the rotating shafts can be parallel or substantially parallel to each other.

Directions of the rotating shaft structure 103 may include an axial direction and a radial direction. The axial direction of the rotating shaft structure 103 is parallel to an axial direction of the rotating shaft. The radial direction of the rotating shaft structure 103 is parallel to a radial direction of the rotating shaft.

In some embodiments, the rotating shaft is a cylinder. A direction, where a radius or a diameter of a cylinder cross-section is, is the radial direction. The axial direction is perpendicular to the radial direction and perpendicular to the cylinder circular cross-section.

In some embodiments, the connection structure 104 is configured to construct or support an electrical connection between the first body 101 and the second body 102. The electrical connection can be used to transmit various electrical signals. The electrical signals include but are not limited to power supply signals and data signals. The data signals may include display data, etc. for the display device to display.

The first connection terminal 1041 and the second connection terminal 1042 both may include terminals capable of transmitting the power supply signals, such as a gold finger.

Figure 4A:
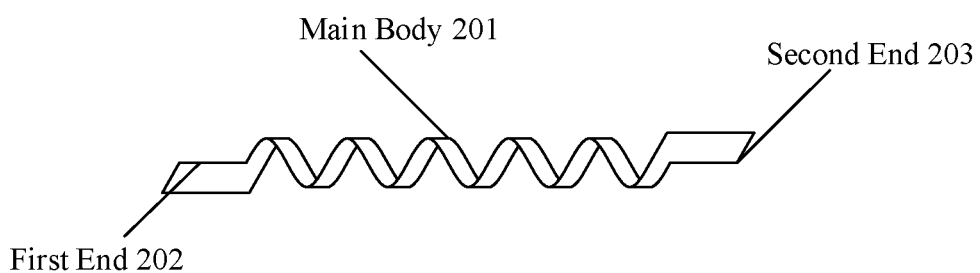
FIG. 4A is a schematic structural diagram of a circuit board provided by the embodiments of the present disclosure.
Figure 4B:
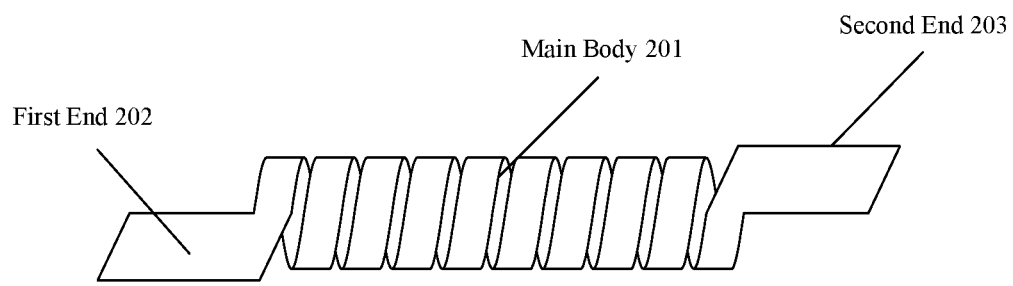
FIG. 4B is a schematic structural diagram of another circuit board provided by the embodiments of the present disclosure.
Figure 4C:
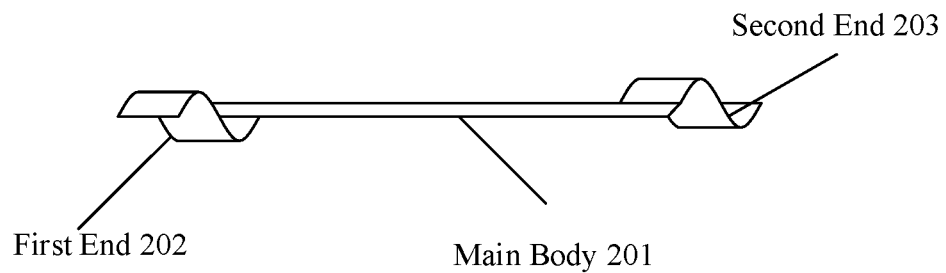
FIG. 4C is a schematic structural diagram of another circuit board provided by the embodiments of the present disclosure.

In the embodiments, as shown in FIG. 4A, FIG. 4B, and FIG. 4C, the circuit board 1043 includes a main body 201, and a first end 202 and a second end 203 located at two ends of the main body. At least one first connection terminal 1041 may be configured at the first end 202, and at least one second connection terminal 1042 may be configured at the second end 203. In the embodiments, when a number of the first connection terminal 1041 and the second connection terminal 1042 is more than one, a plurality of the first connection terminals 1041 are configured in parallel at the first end 202, and a plurality of the second connection terminals 1042 configured in parallel at the second end 203.

In the embodiments, a length of the main body of the circuit board 1043 is longer than a length of the first end 202 or a length of the second end 203.

In some embodiments, to place the circuit board 1043 along the axial direction, at least the main body of the circuit board 1043 is placed along the axial direction.

In some embodiments, the first connection terminal 1041 and the second connection terminal 1042 of the connection structure 104 are not configured at the ends of the circuit board 1043. However, transmission wires of the circuit board 1043 are placed at the ends of the circuit board 1043 as the flexible wires. Therefore, to place the circuit board 1043 along the axial direction, the circuit board 1043 as a whole is placed along the axial direction.

In some embodiments, if the connection structure 104 is under a situation without a deformation such as torsion, etc., the first connection terminals 1041 are configured in parallel along a long side of the connection structure 104 at the first end 202. That is, a plurality of the first connection terminals 1041 are aligned at the end of the connection structure 104. If the connection structure 104 is under a situation without a deformation such as torsion, etc., the second connection terminals 1042 are configured in parallel along the long side of the connection structure 104 at the second end 203. That is, a plurality of the second terminals 1042 are aligned at the end of the connection structure 104.

The circuit board 1043 may include a substrate and one or a plurality of transmission wires configured in parallel at the substrate. The substrate may be a plastic substrate, in some embodiments may be a flexible substrate or an elastic substrate, and a thin plate structure. Two ends of the wires are connected to the first connection terminal 1041 and the second connection terminal 1042, respectively.

In some embodiments, the circuit board 1043 is further configured with an insulation layer. The insulation layer wraps outside of the transmission wires to implement an insulation and isolation of the transmission wires from outside.

In some embodiments, the transmission wires at the circuit board 1043 can be configured finely and densely. Compared to a single transmission wire including the flexible wires with an insulation layer, the number of the transmission wires contained at the circuit board 1043 in a unit volume is much more than the number of the flexible wires. In some embodiments, by using the connection structure 104 containing the circuit board 1043 to replace the flexible wires to construct the electrical connection between the first body 101 and the second body 102, for the design of the electronic device may be lighter and thinner.

In some embodiments, the circuit board 1043 is configured along the rotating shaft and non-planarly along the axial direction. That is, the circuit board 1043 is not configured planarly along the axial direction.

Figure 4D:
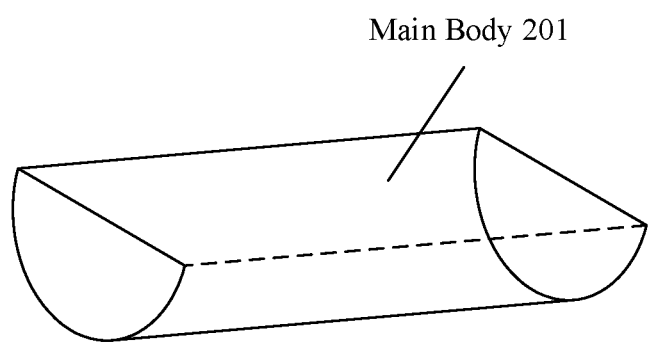
FIG. 4D is a schematic diagram of non-planarly configured circuit board provided by the embodiments of the present disclosure.

The non-planar configuration includes, but is not limited to, a curved configuration or a bent configuration. For example, FIG. 4A to FIG. 4C are bent configurations along the axial direction. FIG. 4D is a curved configuration along the axial direction.

For example, after the circuit board 1043 is configured along the axial direction, the circuit board 1043 at the cross-section perpendicular to the axial direction is a polyline or a curved line.

The polyline may include a L-shaped polyline, a V-shaped polyline, etc. The curved line includes a regular curved line such as various types of arcs, etc., or an irregular curved line such as a wave line, etc. For example, the curved line may be an O-shaped curved line, a U-shaped curved line, an arc of an outer arc of a sector, etc. With reference to FIG. 4D, a cross-section of the main body of the circuit board along an axis is the U-shaped curved line.

In some embodiments, the circuit board 1043 may be a flexible printed circuit (FPC). The FPC can have flexible deformation with an action of external force. After the external force is canceled, the flexible circuit board may maintain the flexible deformation caused by the external force and may also recover part of the deformation. However, the flexible circuit is generally unable to recover to an original state.

Figure 3:
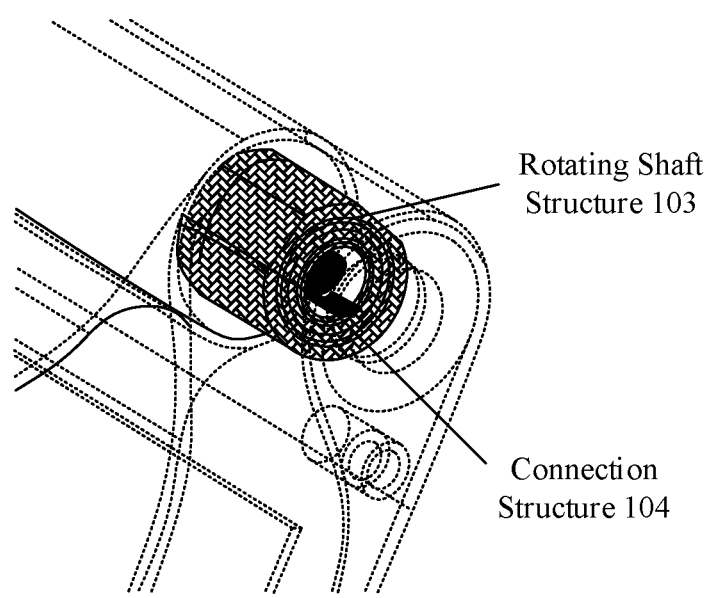
FIG. 3 is a schematic structural diagram of a connection structure located at the rotating shaft structure according to the embodiments of the present disclosure.

If the circuit board 1043 is the flexible circuit, the circuit board 1043 can be curled at the cross-section perpendicular to the axial direction to form one or a plurality of curled rings. FIG. 3 shows a schematic diagram of the circuit board of the connection structure 104 spirally configured in an accommodation space formed at a center of the rotating shaft of the rotating shaft structure.

In some embodiments, the circuit board 1043 may also be a non-flexible circuit board, such as an elastic circuit board 1043. The elastic circuit 1043 may have an elastic deformation with an added external force. The elastic deformation disappears automatically when the external force is removed, such that the elastic circuit board 1043 returns to the original state.

In other embodiments, the circuit board 1043 may be a rigid circuit board 1043. During a manufacturing process, the rigid circuit board 1043 is shaped into an above-mentioned specific shape configured as a non-curved surface.

In some embodiments, the electronic apparatus uses the connection structure 104, which contains a circuit board 1043, to replace the flexible wires to electrically connect the first body 101 and the second body 102. By using characteristics of the transmission wires of the circuit board 1043 being configured densely, the electronic apparatus can be designed lighter and thinner. Further, by using the connection structure 104 containing the connection terminals to build the connection between the first body 101 and the second body 102, when the electronic apparatus is assembled, the assembly task does not need to focus on the connection of the flexible wires, but one-time plug and unplug of the connection structure 104 including a plurality of connection terminals can be realized, thereby simplifying assembly of the electronic apparatus. In addition, in the embodiments, the circuit board 1043 is configured non-planarly along the axial direction of the rotating shaft structure 103 to use any non-planar accommodation space along the axial direction to configure a connection board. This is beneficial for lightening and thinning the electronic apparatus. Since the non-planar configuration of the circuit board 1043 along the axial direction can enlarge the area of the circuit board 1043, the area of the circuit board 1043 is enlarged without changing a dimension of the transmission wires. More transmission wires can be configured at the circuit board 1043, and the more first connection terminals 1041 and the second connection terminals 1042 at the two ends may also be configured. When there are many electrical connections between the first body 101 and the second body 102, and the circuit board 1043 occupies as little space of the electronic apparatus as possible, the circuit board 1043 can realize the multiple connections of the first body 101 and the second body 102.

In some embodiments, the circuit board 1043 has a first state and a second state. At the first state, the connection structure 104 is stretched along the axial direction and has a first length along a configuration direction of the connection structure 104. At the second state, the connection structure 104 is not stretched along the axial direction and has a second length along the configuration direction of the connection structure 104. The first length is longer than the second length.

In some embodiments, the connection structure 104 has at least two states. At the first state, external force may exist to stretch the circuit board 1043, such that the connection structure 104 has a first length along the configuration direction based on elastic deformation, flexible deformation that can partially recover, or redundant structure design. At the second state, the external force for stretching the connection structure 104 is cancelled, the connection structure 104 switches a configuration length along the configuration direction to a second length based on the elastic deformation, flexible deformation that can partially recover, etc.

In the embodiments, the external force may be applied by the first body 101 or the second body 102.

In some embodiments, the configuration direction of the connection structure 104 includes a configuration direction of the main body of the circuit board 1043, a configuration direction of the at least one first connection terminal 1041 at the first end 202, and a configuration direction of the at least one second connection terminal 1042 at the second end 203. The configuration direction of the circuit board 1043 is at the axial direction of the rotating shaft, and the configuration directions of the first end 202 and the second end 203 may be opposite and perpendicular to the configuration direction (i.e., the axial direction) of the main body of the circuit board 1043.

By rotating the first body 101 and the second body 102 based on the rotating shaft structure 103, the angle between the first body 101 and the second body 102 is different. Through a latch or contact of the connection terminals, the connection structure 104 forming the electrical connection between the first body 101 and the second body 102 may be stretched at some certain positions, such that the first body 101 or the second body apply the external force to the connection structure 104 to switch the connection structure 104 between the first state and the second state.

Correspondingly, the main body of the circuit board 1043 has a first sub-state and a second sub-state. When the connection structure 104 is at the first sub-state, the main body of the circuit board 1043 is at the first sub-state. At this point, the main body of the circuit board 1043 is deformed to cause the connection structure 104 to have the first length at the overall configuration direction. When the connection structure 104 is at the second sub-state, the main body of the circuit board 1043 is at the second sub-state. At this point, the circuit board 1043 is deformed to recover at least partially from the deformed state, such that the circuit board 1043 reduces the length of the connection structure 104 at the overall configuration direction. The connection structure 104 has the second length. In some embodiments, the first end 202 including the at least one first connection terminal 1041 and the second end 203 including the at least one second connection terminal 1042 are not deformed.

In other embodiments, as shown in FIG. 4C, the first end 202 including the at least a first connection terminal 1041 and the second end 203 including the at least a second connection terminal 1042 are configured with redundant structures, which have a third sub-state and a fourth sub-state. When the connection structure 104 is at the first state, the redundant structures have the third sub-state and are deformed to cause the connection structure 104 to have the first length at the overall configuration direction. When the connection structure 104 is at the second state, the redundant structures have the fourth sub-state and are deformed to recover fully or partially, such that the connection structure 104 has the second length shorter than the first length at the overall configuration direction.

The connection structure 104 provided by the embodiments of the present disclosure has at least two states, which can satisfy the lengths required by the electrical connection when the two bodies are at different relative positions. When the connection structure 104 has only a single length, the single length cannot satisfy the maximal length required by the two bodies at a specific angle. Therefore, the single length may cause an unstable electrical connection and damage by bundling or stretching the wires. By having at least two states, the connection structure 104 reduces the problems related to the single length situation.

In some embodiments, when the first body 101 is at a first angle relative to the second body 102, the connection structure 104 is at the first state. When the first body 101 is at a second angle relative to the second body 102, the connection structure 104 is at the second state. The second angle is larger than the first angle.

In some embodiments, the first angle may be an angle, at which the first body 101 and the second body 102 are engaged, and the first angle may be assumed to be 0°. The second angle may be any angle larger than the first angle, for example, 180°. If the two bodies are at 180°, and the first body 101 and the second body 102 are located at a same plane.

In some embodiments, the first angle is 0°, and the second angle may be 360°.

In some embodiments, the circuit board 1043 is spirally configured along the axial direction.

As shown in FIG. 4B, the circuit board 1043 is spirally configured along the axial direction, which causes the circuit board 1043 to have a plurality of spiral cycles. Distance changes between the spiral cycles or radius changes of the spiral cycles can change the length of the connection structure 104 at the configuration direction.

In some embodiments, the circuit board 1043 is in a wavy shape along a direction perpendicular to the axial direction and configured along the axial direction. FIG. 4A shows that the circuit board 1043 is in the wavy shape along the axial direction.

In some embodiments, the circuit board 1043 is in the wavy shape. The wavy shape is constituted by a plurality of arcs with a same wavy degree and may also be constituted by a plurality of arcs with different wavy degrees.

In some embodiments, the rotating shaft structure 103 has an accommodation space at the axial direction. The circuit board 1043 is located in the accommodation space and configured along the axial direction.

For example, the rotating shaft structure 103 includes a rotating shaft center and a rotary drum rotating relative to the center of the rotating shaft. A hollow chamber is placed at the center of the rotating shaft. The hollow chamber is the accommodation space, and for better use of the space of the electronic apparatus, the circuit board 1043 is placed in the accommodation space and configured along the axial direction. The rotary drum is opened at the center of the rotating shaft for the first connection terminal 1041 and the second connection terminal 1042 to pass through and be electrically connected to the first body 101 and the second body 102, respectively.

In some embodiments, the rotating shaft structure 103 is configured along the axial direction outside the rotating shaft of the rotating shaft structure 103.

In some embodiments, some rotating shaft centers have very small volumes, and no hollow chamber is configured at the rotating shaft centers. That is, the rotating shaft is a solid shaft. The circuit board 1043 may be configured along the axial direction outside the rotating shaft.

For example, the circuit board 1043 is a flexible circuit board, and the flexible circuit board is configured around the rotating shaft and along the axial direction.

In some embodiments, the circuit board 1043 has at least two spiral cycles and is spirally configured along the axial direction. When the connection structure 104 is at the first state and the second state, the two adjacent spiral cycles overlap partially with each other.

In some embodiments, the connection structure 104 has two states. The circuit board 1043 is spirally configured along the axial direction rotates to form a spiral cycle. In these embodiments, when the connection structure 104 switches between the first state and the second state, the two adjacent spiral cycles of the circuit board 1043 overlap partially with each other, and difference is merely dimension changes at an overlapped part. If the connection structure 104 is at the first state and the second state, the two adjacent spiral cycles maintain overlapping to reduce damage of the circuit board 1043 due to friction between two adjacent spiral cycle boundaries.

When the connection structure 104 is at the first state, the circuit board 1043, overlapping portion of the two adjacent spiral cycles of the circuit board 1043 is a first measurement. When the connection structure 104 is at the second state, the overlapping portion of the two adjacent spiral cycles of the circuit board 1043 is a second measurement. The first measurement is smaller than the second measurement. Increase from the first measurement to the second measurement causes the connection structure 104 to be reduced from the first length to the second length at the configuration direction.

In some embodiments, the circuit board 1043 has the at least two spiral cycles and is spirally configured along the axial direction. The two adjacent spiral cycles have distances, when the connection structure 104 is at the first state and the second state. Since any two adjacent spiral cycles have the distances, when the connection structure 104 is at the first state and the second state, the boundaries of the two adjacent spiral cycles do not have mutual friction. This reduces the damage to the circuit board 1043.

When the connection structure 104 is at the first state, the distance between the two spiral cycles of the circuit board 1043 is a first distance. When the connection structure 104 is at the second state, the distance between the two spiral cycles of the circuit board 1043 is a second distance. The first distance is shorter than the second distance. Increase of the first distance to the second distance causes the connection structure 104 to reduce the first distance to the second distance at the configuration direction.

In some embodiments, part of the circuit board 1043, which is configured along the axial direction, has at least two layers. The two layers of the circuit board 1043 may be two layers formed by injection molding or may be at least two layers formed by folding after the circuit board 1043 is produced. At this point, the part of the circuit board 1043 configured along the axial direction is folded to form the at least two layers.

In other embodiments, the circuit board 1043 provides configuration positions for the transmission wires through the substrate. A thickness of the substrate can be made very small. At one aspect, the small thickness of the substrate facilitates a spiral configuration or a wavy configuration at the axial direction of the rotating shaft structure 103, and at another aspect, when the number of the first connection terminals 1041 and the second connection terminals 1042 is many, the circuit board 1043 can be folded to multiple layers to reduce single layer area of the circuit board 1043.

For example, assuming that the connection board include the number N first connection terminals 1041 and the number N second connection terminals 1042, if the connection board is tilted at a circuit board 1043, the circuit board 1043 is caused to be wide at a direction perpendicular to an extending direction of the connection terminals, and at this point, to reduce a width of the circuit board 1043, at least the main body 201 of the circuit board 1043 can be folded, such that the width of the main body 201 is at least reduced.

Figure 5A:
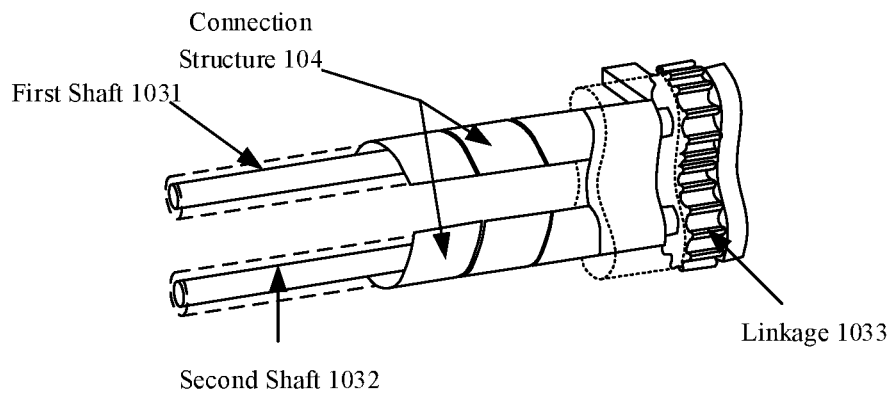
FIG. 5A is a schematic diagram of a combined structure of a connection structure and a rotating shaft structure provided by the embodiments of the present disclosure.
Figure 5B:
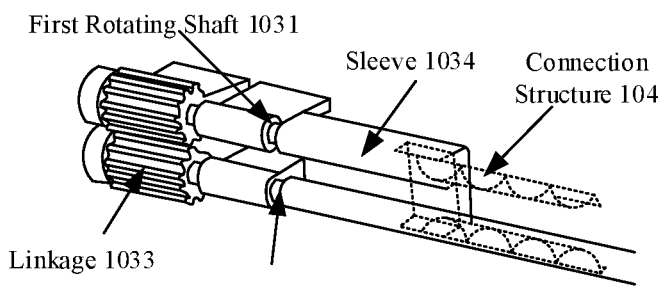
FIG. 5B is a schematic diagram of a combined structure of another connection structure and a rotating shaft structure provided by the embodiments of the present disclosure.
Figure 5C:
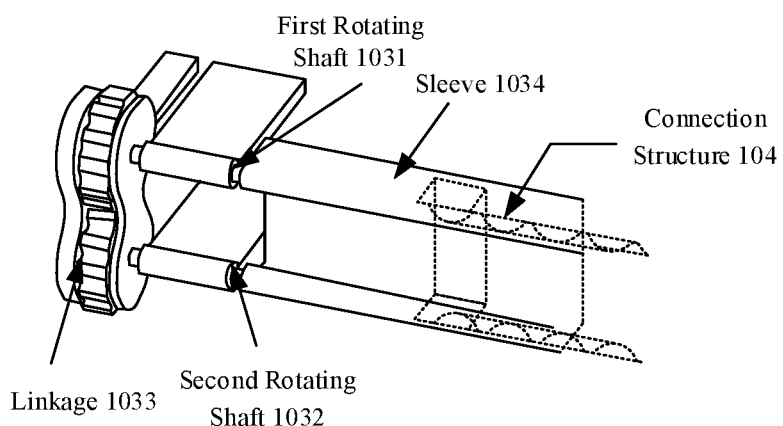
FIG. 5C is a schematic diagram of a combined structure of another connection structure and a rotating shaft structure provided by the embodiments of the present disclosure.

In some embodiments, as shown in FIG. 5A, FIG. 5B, and FIG. 5C, the rotating shaft structure 103 includes a first rotating shaft 1031, a second rotating shaft 1032, a linkage component 1033, a sleeve 1034, and the circuit board 1043. The first rotating shaft 1031 is connected to the first body 101. The second rotating shaft 1032 is connected to the second body 102. The linkage component 1033 is connected to the first rotating shaft 1031 and the second rotating shaft 1032, and configured to cause the first rotating shaft 1031 and the second rotating shaft 1032 to rotate simultaneously. The sleeve 1034 is sleeved outside of the first rotating shaft 1031 and the second rotating shaft 1032. The circuit board 1043 is configured along the axial direction of the first rotating shaft 1031, and inside the sleeve 1034 along a perpendicular direction perpendicular to the axial direction, and along the axial direction of the second rotating shaft 1032.

In some embodiments, the rotating shaft structure 103 is a dual-rotating-shaft structure 103. The first rotating shaft 1031 is connected to the first body 101. The second rotating shaft 1032 is configured in parallel to the first rotating shaft 1031 and connected to the second body 102.

In some embodiments, the rotating shaft structure 103 further includes a linkage 1033, and the linkage 1033 cause the first rotating shaft 1031 and the second rotating shaft 1032 to rotate simultaneously.

For example, the linkage 1033 includes a first meshing section fixedly connected to the first rotating shaft 1031 and rotating with the first rotating shaft 1031 simultaneously, a second meshing section fixedly connected to the second rotating shaft 1032 and rotating with the second rotating shaft 1032 simultaneously.

The first meshing section and the second meshing section may be meshed by straight teeth, or may be meshed by helical teeth. In some embodiments, if the first rotating shaft 1031 is a driving shaft, the first meshing section rotates with the first rotating shaft 1031, and the second meshing section rotates based on the meshing with the first meshing section and drives the second rotating shaft 1032 to rotate. In some embodiments, the driving shaft may also be the second rotating shaft 1032, and a driven shaft may be the first rotating shaft 1031.

In some embodiments, the rotating shaft structure 103 further includes a sleeve 1034. The sleeve 1034 is at the outside of the first rotating shaft 1031 and the second rotating shaft 1032. In one aspect, the sleeve can protect the first rotating shaft 1031 and the second rotating shaft 1032 by buffering collisions. In another aspect, if the first rotating shaft 1031 and the second rotating shaft 1032 are relatively long, when the linkage 1033 is placed only at one or multiple certain positions, the sleeve 1034 also supports the two rotating shafts and reduces problems of unnecessary deformation of the two rotating shafts due to small supporting force provided by the two rotating shafts.

In some embodiments, the circuit board 1043 is configured along the axial directions of the first rotating shaft 1031 and the second rotating shaft 1032. For example, the circuit board 1043 is spirally wrapped at the outside of the first rotating shaft 1031 and the second rotating shaft 1032, and when crossing the two rotating shafts, is configured at a direction of the sleeve 1034. The sleeve 1034 is configured to hide the circuit board 1043 and protect the circuit board 1043.

The sleeve 1034 has a plurality of structures, and following two options are available.

First, the sleeve 1034 has a first through hole and a second through hole. The first rotating shaft 1031 passes through the first through hole, and the second rotating shaft 1032 passes through the second through hole.

Second, the sleeve is an inverted U-shaped groove, and the first rotating shaft 1031 and the second rotating shaft 1032 pass through two ends at the bottom of the groove.

As shown in FIG. 4A to FIG. 4B, the embodiments provide a connection structure, which includes at least one first connection terminal, at least one second connection terminal, a circuit board connected to the at least one first connection terminal and the at least one second connection terminal and configured non-planarly along a pre-determined direction.

In some embodiments, the non-planar configuration includes, but is not limited to, the above-mentioned bent configuration or curved configuration. As shown in FIG. 4A to FIG. 4C, the main body of the circuit board is the bent configurations. FIG. 4D shows that the main body of the circuit board is the curved configuration.

The non-planar configuration, in one aspect, can use space at the pre-determined direction to enlarge the area of the circuit board, such that more transmission wires or connection terminals can be configured to implement a configuration of a large amount of the transmission wires or connection terminals. In another aspect, compared to the flexible wires, the connection structure has characteristics of small volume and high wire density per unit area.

In some embodiments, as shown in FIG. 4A, FIG. 4B, and FIG. 4C, the circuit board has the redundant structure, which can be stretched along the pre-determined direction. When the connection structure is at the first state, the redundant structure is stretched at the pre-determined direction, and the connection structure has the first length along the configuration direction of the connection structure. When the connection structure is at the second state, the redundant structure is not stretched at the pre-determined direction, and the connection structure has the second length along the configuration direction of the connection structure. The first length is longer than the second length.

The configuration direction refers to an overall configuration direction of the main body of the circuit board, the first end, and the second end.

In embodiments of the present disclosure, the redundant structure can support the telescoping of the length of the connection structure at the configuration direction. When the first body and the second body, which used the connection structure to form the electrical connection, rotate, the redundant structure of the connection structure can provide a length required by rotation and stretching. The stretching friction formed by relative movement of the first body and the second body due to a fixed length is reduced, and service lifetime of the connection structure is extended. A stability of the electrical connection of the electronic apparatus, which uses the connection structure to electrically connect the first body and the second body, is reduced.

In embodiments of the present disclosure, the redundant structure further includes the main body of the circuit board, which is spiral along the pre-determined direction. As shown in FIG. 4B, the main body of the circuit board is spiral. Extension directions of the plurality of spiral cycles are the same, that is, the pre-determined direction.

As shown in FIG. 4A, in some embodiments, the redundant structure includes the main body of the circuit board, which is in a wavy shape along a direction perpendicular to the pre-determined direction.

With reference to FIG. 4A to FIG. 4C, the first end 202 of the circuit board is configured with the at least one first connection terminal. The second end 203 of the circuit board is configured with the at least one second connection terminal. The first end 202 and the second end 203 are located at two opposite ends of the main body of the circuit board.

In some embodiments, with reference to FIG. 4C, the redundant structures are located at the first end and the second end but not located at the main body of the circuit board.

The connection structure provided by the embodiments may be a plate-shape wire including the substrate and different from the flexible wires, uses the circuit board to provide the transmission wires and the connection terminals, and can reduce a space volume required by the electrical connection compared to the flexible wires.

At the same time, the circuit board provided by the embodiments is configured with the redundant structure. The redundant structure can provide an extra length required by the relative rotation of the two bodies, which are connected by the electrical connection of the connection structure, and implement the stable electrical connection between the two bodies.

In some embodiments provided by the present disclosure, the disclosed apparatus and method can be implemented in different manners. The above-mentioned apparatus embodiments are merely illustrative, for example, the unit division is merely a logical function division and may have other division methods in practical applications, such as a plurality of units or components can be combined or can be integrated into another system, or some characteristics may be omitted or not be performed. Coupling, direct coupling, or communication connection between the components shown or discussed may be through some interfaces, indirect coupling or communication connection of the device or unit, and may be electrical, mechanical, or in other forms.

The units described above as separate components may or may not be physically separated, and the components displayed as units may or may not be physical units, that is, may be located in one place or distributed to multiple network units. According to actual needs, some or all of the units can be selected to achieve the purpose of the solution of the embodiments.

In addition, in the embodiments of the present disclosure, the functional units may be all integrated into one processing module, or each unit may be separately used as a unit, or two or more units may be integrated into one unit. The above-mentioned integrated unit can be implemented in the form of hardware, or in the form of combinations of hardware and software functional units.

Those of ordinary skill in the art may understand that all or part of the processes of the above-mentioned method embodiments may be completed by a hardware related to a program instruction. The above-mentioned program may be stored in a computer-readable storage medium. When the program is executed, the processes included in the method embodiments are executed. The above-mentioned storage medium includes various media that can store program codes, such as a mobile storage device, a read-only memory (ROM), a random-access memory (RAM), a magnetic disk, an optical disk, etc.

The above-mentioned embodiments are merely specific implementations of the present disclosure, but the scope of the present disclosure is not limited to the above-mentioned embodiments. Within the technical scope disclosed in the present disclosure, any skilled in the art can easily think of changes or replacements, which are in the scope of the present disclosure. Therefore, the scope of the present disclosure shall be subject to the scope of the claims.

What is claimed is:

1. An electronic apparatus, comprising:
a first body;
a second body;
a rotating shaft structure, configured to connect the first body and the second body;
a connection structure, including a first connection terminal connected to the first body, and a second connection terminal connected to the second body; and
a circuit board comprising a plastic substrate and a plurality of transmission wires configured in parallel in the substrate, two ends of the transmission wires are connected to the first connection terminal and the second connection terminal respectively, and the circuit board is configured non-planarly along an axial direction of the rotating shaft structure.

2. The electronic apparatus of claim 1, wherein the circuit board further comprising:
a main body;
a first end, located at an end of the main body; and
a second end, located at another end of the main body.

3. The electronic apparatus of claim 2, the main body having a first sub-state and a second sub-state, wherein:
at the first sub-state, the main body is deformed to support the connection structure to have a first length at a configuration direction; and
at the second sub-state, the main body deforms to support the connection structure have a second length at the configuration direction.

4. The electronic apparatus of claim 2, wherein:
the first connection terminal is configured at the first end; and
the second connection terminal is configured at the second end.

5. The electronic apparatus of claim 1, the circuit board having a first state and a second state, wherein:
at the first state, the connection structure is stretched along the axial direction and has a first length along a configuration direction of the connection structure;
at the second state, the connection structure is not stretched along the axial direction and has a second length along the configuration direction of the connection structure; and
the first length is longer than the second length.

6. The electronic apparatus of claim 5, wherein:
in response to the first body being at a first angle relative to the second body, the circuit board is at the first state;
when the first body is at a second angle relative to the second body, the circuit board is at the second state; and
the second angle is larger than the first angle.

7. The electronic apparatus of claim 5, wherein:
the circuit board is spirally configured along the axial direction; or
the circuit board is in a wavy shape along a direction perpendicular to the axial direction and is configured along the axial direction.

8. The electronic apparatus of claim 7, wherein:
the circuit board has at least two spiral cycles and is spirally configured at the axial direction; and
when the connection structure is at the first state and the second state, the two adjacent spiral cycles have a distance from each other.

9. The electronic apparatus of claim 5, wherein:
the rotating shaft structure has an accommodation space at the axial direction, and the circuit board is located inside the accommodation space and configured along the axial direction; or
the rotating shaft structure is configured outside a rotating shaft of the rotating shaft structure along the axial direction.

10. The electronic apparatus of claim 1, wherein the circuit board is configured along the axial direction and folded into at least two layers.

11. The electronic apparatus of claim 1, wherein the rotating shaft structure includes:
a first rotating shaft, connected to the first body;
a second rotating shaft, connected to the second body;
a linkage, connected to the first rotating shaft and the second rotating shaft and configured to cause the first rotating shaft and the second rotating shaft to rotate simultaneously;
a sleeve, sleeved outside the first rotating shaft and the second rotating shaft; and
the circuit board, configured along the axial direction of the first rotating shaft, and inside the sleeve along a perpendicular direction perpendicular to the axial direction, and along the axial direction of the second rotating shaft.

12. The electronic apparatus of claim of 12, wherein the linkage includes:
a first meshing section connected to the first rotating shaft and rotating with the first rotating shaft simultaneously;
a second meshing section connected to the second rotating shaft and rotating with the second rotating shaft simultaneously; and
the first meshing section and the second meshing section meshed by straight teeth or by spiral teeth.

13. The electronic apparatus of claim 11, wherein:
the sleeve has a first through hole and a second through hole, the first rotating shaft passing through the first through hole, and the second rotating shaft passing through the second through hole; or
the sleeve is an inverted U-shaped groove, the first rotating shaft and the second rotating shaft passing through two ends at a bottom of the groove.

14. The electronic apparatus of claim 1, the rotating shaft structure further comprising a rotating shaft center and a rotary drum rotating relative to a center of the rotating shaft, wherein:
a hollow chamber is configured at the center of the rotating shaft and is an accommodation space; and
the rotary drum is configured at the center of the rotating shaft for the first connection terminal and the second connection terminal to pass through and be electrically connected to the first body and the second body, respectively.

15. A connection structure, comprising:
a first connection terminal connected to a first body;
a second connection terminal connected to a second body;
a circuit board comprising a plastic substrate and a plurality of transmission wires configured in parallel in the substrate, two ends of the transmission wires are connected to the first connection terminal and the second connection terminal respectively,
wherein the connection structure is a rotating shaft structure and the circuit board is configured non-planarly along an axial direction of the rotating shaft structure.

16. The connection structure of claim 15, wherein the connection structure is configured to electrically connect a first body and a second body.

17. The connection structure of claim 16, wherein:
the circuit board has a redundant structure, is the redundant structure being stretched along the axial direction;
when the connection structure is at a first state, the redundant structure is stretched at the axial direction, and the connection structure has a first length along a configuration direction of the connection structure;
when the connection structure is at a second state, the redundant structure is not stretched at the axial direction, and the connection structure has a second length along the configuration direction of the connection structure; and
the first length is longer than the second length.

18. The connection structure of claim 17, wherein:
the redundant structure supports the connection structure at the configuration direction to telescope; and
the redundant structure includes a main body of the circuit board, the main body being spiral along the axial direction.

19. The connection structure of claim 17, wherein:
the substrate of the circuit board is different from flexible wires.

* * * * *